United States Patent
Huang et al.

(10) Patent No.: US 9,368,505 B2
(45) Date of Patent: Jun. 14, 2016

(54) READ-ONLY MEMORY AND ITS MANUFACTURING METHOD

(75) Inventors: Kai Huang, Jiangsu (CN); Peng Du, Jiangsu (CN); Jianxiang Cai, Jiangsu (CN); Tsung-nten Hsu, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 14/130,470

(22) PCT Filed: Aug. 2, 2012

(86) PCT No.: PCT/CN2012/079554
§ 371 (c)(1),
(2), (4) Date: Dec. 31, 2013

(87) PCT Pub. No.: WO2013/044679
PCT Pub. Date: Apr. 4, 2013

(65) Prior Publication Data
US 2014/0151815 A1   Jun. 5, 2014

(30) Foreign Application Priority Data

Sep. 28, 2011 (CN) .......................... 2011 1 0301094

(51) Int. Cl.
*H01L 27/112* (2006.01)
*H01L 27/02* (2006.01)

(52) U.S. Cl.
CPC .......... *H01L 27/112* (2013.01); *H01L 27/0207* (2013.01); *H01L 27/11266* (2013.01)

(58) Field of Classification Search
CPC .............. H01L 27/112; H01L 27/0207; H01L 27/11266; H01L 27/1266
See application file for complete search history.

(56) References Cited

U.S. PATENT DOCUMENTS 6,323,091 B1 *  11/2001  Lee et al. ....................... 438/275
6,576,517 B1 *   6/2003  Patelmo et al. ............... 438/275
(Continued)

FOREIGN PATENT DOCUMENTS

| CN | 1527390 A | 9/2004 |
|----|-----------|--------|
| CN | 1977358 A | 6/2007 |

(Continued)

*Primary Examiner* — William Coleman
(74) *Attorney, Agent, or Firm* — Muncy, Geissler, Olds & Lowe, P.C.

(57) ABSTRACT

A read-only memory includes a plurality of storage units arranged in an array. The read-only memory includes two kinds of storage units with different structures, the two kinds of storage units with different structures are a first MOS transistor and a second MOS transistor. A source and a drain of the first MOS transistor have the same type, a source and a drain of the second MOS transistor have inverse type. These two kinds of MOS transistors can be used to store binary 0 and 1 respectively. In the manufacturing method of the read-only memory, the same type of drain and source can be manufactured simultaneously, no extra mask plate is needed, so the extra mask plate of a conventional read-only memory can be saved.

6 Claims, 3 Drawing Sheets

(56) References Cited

U.S. PATENT DOCUMENTS

| | | | |
|---|---|---|---|
| 6,577,021 B2 * | 6/2003 | Morishima | H01L 27/1104 257/213 |
| 6,803,283 B1 * | 10/2004 | Chen | H01L 27/112 257/E21.673 |
| 6,908,837 B2 * | 6/2005 | Taniguchi et al. | 438/583 |
| 7,274,075 B2 * | 9/2007 | Yaegashi | 257/391 |
| 8,288,813 B2 * | 10/2012 | Kakoschke | G11C 16/0416 257/314 |
| 8,450,809 B2 * | 5/2013 | Yang et al. | 257/391 |
| 8,629,500 B2 * | 1/2014 | Holz | 257/315 |
| 2002/0034106 A1 | 3/2002 | Zambrano | |
| 2005/0098835 A1 * | 5/2005 | Ushiroda | H01L 27/1052 257/371 |
| 2010/0219469 A1 * | 9/2010 | Min et al. | 257/330 |

FOREIGN PATENT DOCUMENTS

| | | |
|---|---|---|
| CN | 101179076 A | 5/2008 |
| CN | 101872764 A | 10/2010 |

* cited by examiner

READ-ONLY MEMORY AND ITS MANUFACTURING METHOD

FIELD OF THE INVENTION

The present invention relates to a semiconductor memory, and more particularly relates to a read-only memory and a manufacturing method thereof.

BACKGROUND OF THE INVENTION

Read-only memory (ROM) is one kind of semiconductor memories. As its name implies, the read-only memory can only read stored information, and can not erase and rewrite the stored information. Data stored by the ROM is stable, even in the absence of power, the stored data can not be lost.

The read-only memory contains a plurality of storage units arranged in an array and configured to store information. Currently, the most common read-only memory in a market is a mask read-only memory. The manufacturing of the mask read-only memory needs an extra mask plate to form the storage units configured to store information. Performing an ion implantation process by using the extra mask plate to form two kinds of storage units with different threshold voltages. The information of the storage units is read by an operating voltage ranged between two kinds of threshold voltages. For example, when reading the information, the storage unit with the threshold voltage below the operating voltage will be turned on to obtain an electrical signal. The storage unit with a threshold voltage higher than the operating voltage will be turned off and obtain no electrical signal. Thus the information of the mask read-only memory can be read according to the above mentioned method.

However, this kind of mask read-only memory needs extra mask plates to form two kinds of storage units with different threshold voltages, which increases the manufacturing cost of the read-only memory.

SUMMARY OF THE INVENTION

The present disclosure is directed to provide a manufacturing method of a read-only memory, which saves the extra mask plate in the mask read-only memory, a manufacturing cycle of the read-only memory can be shortened, a manufacturing cost of the read-only memory can be reduced.

A read-only memory includes a plurality of storage units arranged in an array, the read-only memory includes two kinds of storage units with different structures, the two kinds of storage units with different structures are a first MOS transistor and a second MOS transistor, a source and a drain of the first MOS transistor have the same type, a source and a drain of the second MOS transistor have inverse types.

According to one embodiment, the two kinds of storage units with different structures are P-type storage units, the source and the drain of the first MOS transistor are P-type, the drain of the second MOS transistor is P-type, the source of the second MOS transistor is N-type.

According to one embodiment, the two kinds of storage units with different structures are N-type storage units, the source and the drain of the first MOS transistor are N-type, the drain of the second MOS transistor is N-type, the source is P-type.

According to one embodiment, the first MOS transistor and the second transistor are both provided with control gates of their own, the first MOS transistor and the second MOS transistor are both provided with lightly doped drain regions located between the drain and its control gate and between the source and its control gate.

A method of manufacturing the read-only memory according to claim 1, the read-only memory comprising storage units and peripheral devices surrounding the storage units, the method includes:

step 1, providing a silicon substrate, forming active regions of the storage units and the peripheral devices on the silicon substrate simultaneously;

step 2, forming a gate oxide dielectric and a control gate of the storage units and the peripheral devices on surfaces of the active regions;

step 3, forming a source and a drain of a first MOS transistor and a drain or a source of a second MOS transistor of the storage unit, and a source and a drain of the peripheral device on an active region on two sides of the control gate simultaneously, the source of the first MOS transistor and the source or the drain of the second MOS transistor having the same type, the source of the first MOS transistor and the source and the drain of the peripheral device having the same type; and step 4, forming a source and a drain of the second MOS transistor and a source and a drain of the peripheral device on the active region on two sides of the control gate simultaneously, the source of the first MOS transistor and the source or the drain of the second MOS transistor having inverse types, the source of the first MOS transistor and the source and the drain of the peripheral device having inverse types.

According to one embodiment, step 3 includes:

step 31, coating a photoresist on a surface of the silicon substrate with the control gate;

step 32, removing photoresists on regions of the drain and the source of the first MOS transistor to be formed, and removing photoresists on regions of the drain or the source of the second MOS transistor to be formed which have the same type with the source of the first MOS transistor and on regions of the drain and the source of the peripheral device simultaneously;

step 33, performing an ion implantation to the region which has been removed from the photoresist to form a source and a drain; and step 34, removing the photoresist remained on the surface of the silicon substrate after the ion implantation process.

According to one embodiment, step 32 includes:

providing a first drain and source mask plate, defining a region of the drain and the source of the first MOS transistor and a region of the drain or a region of the source of the second MOS transistor which have the same type with the source of the first MOS transistor and a region of the source and the drain of the peripheral device on a first drain and source mask plate;

exposing a photoresist located on a surface of the of the silicon substrate with the control gate by using the first drain and source mask plate, developing and removing the photoresist formed on the drain region and the source region defined by the first drain and source mask plate on the surface of the silicon substrate.

According to one embodiment, step 4 includes:

step 41, coating a photoresist on the surface of the silicon substrate with the control gate;

step 42, removing the photoresist formed on regions of the source and the drain of the second MOS transistor which has inverse type with the source of the first MOS transistor and the source and drain of the peripheral device;

step 43, performing an ion implantation process which has inverse type with the source of the first MOS transistor to a region which has been removed from the photoresist to form a source and a drain; and step 44, removing the photoresist remained on the surface of the silicon substrate after the ion implantation, According to one embodiment, step 42 includes:

providing a second drain and source mask plate, defining a region of the source or drain of the second MOS transistor which has inverse type with the source of the first MOS transistor and a region of the source and the drain of the peripheral device on the second drain and source mask plate;

exposing the photoresist located on the surface of the silicon substrate with the control gate by using the second drain and source mask plate, developing and removing the photoresist formed on the drain region and the source region defined by the first drain and source mask plate on the surface of the silicon substrate.

In the read-only memory and its manufacturing method, the storage units contain a MOS transistor which has the same type of drain and source and a MOS transistor which has different types of drain and source, these two kinds of MOS transistors can be used to store binary 0 and 1 respectively. In the manufacturing method of the read-only memory, the same type of drain and source can be manufactured by using one source and drain mask plate simultaneously, which is compatible with the common manufacturing process of a MOS device, no extra mask plate is needed, so the extra mask plate of a conventional read-only memory can be saved.

DETAILED DESCRIPTION OF THE EMBODIMENTS

The present disclosure provides a read-only memory and its manufacturing method, which can save an extra mask plate of the conventional read-only memory, the manufacturing circle of the read-only memory thus can be shortened, the cost can be reduced.

Figure 1:
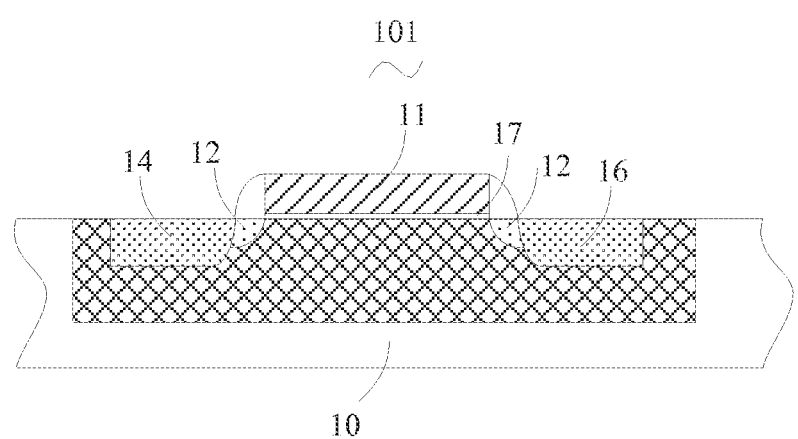
FIG. 1 is a schematic view of the first MOS transistor of the read-only memory in accordance with one embodiment.

An embodiment of a read-only memory includes a plurality of storage units arranged in an array. The read-only memory includes two kinds of storage units with different structures. The two kinds of storage units include a first MOS transistor shown in FIG. 1 and a second MOS transistor shown in FIG. 2. Referring to FIG. 1, a source 14 and a drain 16 of the first MOS transistor have the same type, a source 18 and a drain 20 of the second MOS transistor have inverse types.

Figure 2:
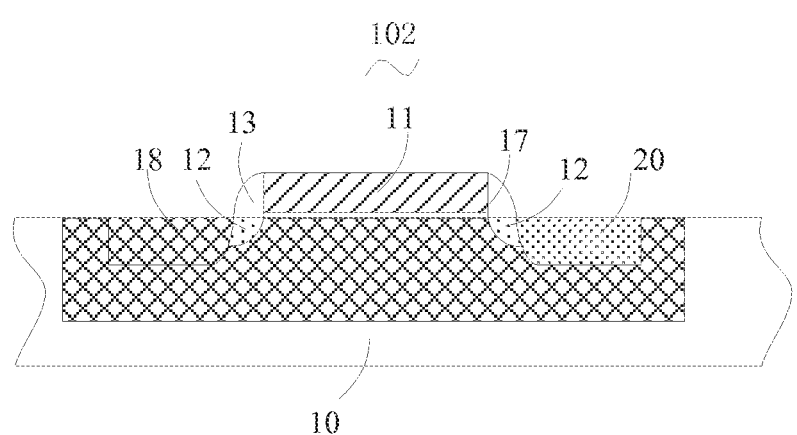
FIG. 2 is a schematic view of the second MOS transistor of the read-only memory in accordance with one embodiment.

Taking two different kinds of storage units which are both P-type storage units as an example, a source 14 and a drain 16 of a first MOS transistor 101 shown in FIG. 1 are both P-type, a drain 20 of a second MOS transistor 102 shown in FIG. 2 is P-type, a source 18 of the second MOS transistor 102 is N-type. When an operating voltage is applied to a control gate 11 of the first MOS transistor 101 and the second MOS transistor 102, the first MOS transistor 101 can be turned on to achieve an initial writing or reading of a current. As the drain 20 and the source 18 of the second MOS transistor 102 have inverse types, they can not be turned on. Thus an initial writing and reading of the binary 0 and 1 of the read-only memory can be achieved. Since the control gate of the P-type storage unit is usually applied with a negative voltage, the source 18 of the second MOS transistor 102 shown in FIG. 2 is N-type, it is usually applied with a positive low voltage in the working state, the second MOS transistor 102 shown in FIG. 2 is equivalent to a reverse biased diode in the working state. In alternative embodiments, the type of the drain 20 and the source 18 of the second MOS transistor 102 can be selected according to the operating voltage of the second MOS transistor 102 as long as the second MOS transistor 102 is equivalent to a reverse biased diode in the working state.

Taking two different kinds of storage units which are both N-type storage units as an example, a source 14 and a drain 16 of the first MOS transistor 101 shown in FIG. 1 are both N-type, a drain 20 of a second MOS transistor 102 shown in FIG. 2 is N-type, a source 18 of a second MOS transistor 102 is P-type. For the same reason as the P-type storage units, when the operating voltage is applied to the control gate 11 of the first MOS transistor 101 and the second MOS transistor 102, the first MOS transistor 101 can be turned on to achieve an initial writing or reading of a current. As the drain 20 and the source 18 of the second MOS transistor 102 are inverse types, they can not be turned on. Thus an initial writing and reading of the binary 0 and 1 of the read-only memory can be achieved. Since the control gate of the N-type storage unit is usually applied with a positive voltage, the source 18 of the second MOS transistor 102 shown in FIG. 2 is P-type, it is usually applied with a positive low voltage (usually zero) in the working state, the second MOS transistor 102 shown in FIG. 2 is equivalent to a reverse biased diode in the working state. In other embodiments, the type of the drain 20 and the source 18 of the second MOS transistor 102 can be selected according to the operating voltage of the second MOS transistor 102 as long as the second MOS transistor 102 is equivalent to a reverse biased diode in the working state.

Referring to FIG. 1 and FIG. 2, the first MOS transistor 101 and the second MOS transistor 102 are provided with their own control gates 11 respectively. Referring to FIG. 1, lightly doped drain (LDD) regions 12 are disposed both between the drain 16 and the source 14 of the first MOS transistor 101 and the control gate 11, and are disposed between the drain 20 and the source 18 of the second MOS transistor 102 and their control gates 11.

In the method of manufacturing the read-only memory, the read-only memory includes storage units and peripheral devices surrounding the storage units, referring to FIG. 1 and FIG. 2, the method includes the following steps:

Step 1, a silicon substrate is provided, active regions of the storage units and the peripheral devices are formed on the silicon substrate simultaneously. The active regions are regions where the devices are manufactured on a wafer. The MOS transistors shown in FIG. 1 and FIG. 2 are manufactured in the active regions 10.

Figure 3:
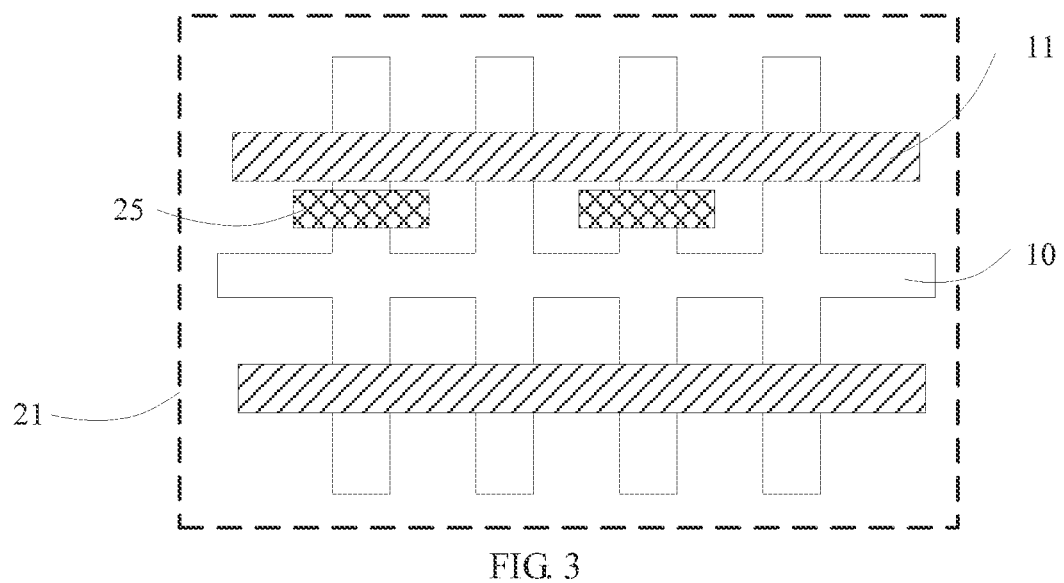
FIG. 3 is a schematic partial layout of the storage unit the read-only memory in accordance with one embodiment.

Step 2, a gate oxide dielectric and a control gate of the storage units and the peripheral devices are formed on a surface of the active regions. Referring to FIG. 2 and FIG. 3, the gate oxide dielectric 17 and the control gate 11 of the storage unit are formed on a surface of the active region 10. The gate oxide dielectric 17 and the control gate 11 of the storage units and the peripheral devices are manufactured simultaneously.

Based on the MOS transistors of the storage units shown in FIG. 1 and FIG. 2, step 2 is carried out after step 1.

In the present method of manufacturing the read-only memory, before the source and the drain of the first MOS transistor, the second MOS transistor, and the peripheral devices are formed, i.e. before step 3 and step 4 described below, the method further includes the following steps: referring to FIG. 1 and FIG. 2, Step a, the first MOS transistor, the second MOS transistor and the lightly doped drain region 12 of the peripheral device are formed on the active region 10 of the control gate 11.

Step b, after the lightly doped drain region 12 is formed, a sidewall 13 is formed on two sides of the control gate 11. An insulated dielectric layer such as silicon oxide or silicon nitride is grown on the surface of the control gate 11, and then the insulated dielectric layer is etched to form the sidewall 13.

Step 3, referring to FIG. 1 and FIG. 2, the source 14 and the drain 16 of the first MOS transistor 101 and the drain 20 or the source 18 of the second MOS transistor 102 which has the same type with the source 14 of the first MOS transistor 101, and the source and the drain of the peripheral devices which have inverse type with the source 14 of the first MOS transistor 101 are formed on active regions 10 on two sides of the control gates 11 simultaneously. As descried above, the drain 20 and the source 18 of the second MOS transistor 102 have inverse type, in order to be compatible with the current test and process, the drain 20 of the second MOS transistor 102 is preferably selected to be the same type as the source 14 of the first MOS transistor 101, i.e. the drain 20 of the second MOS transistor 102 and the source 14 and the drain 16 of the first MOS transistor 101 are manufactured simultaneously. For example, the storage unit is a P-type of storage unit, the drain 16 and the source 14 of the first MOS transistor 101 and the drain 20 of the second MOS transistor 102 are formed in the process of P+ ion implantation. If the storage unit is an N-type of storage unit, the drain 16 and the source 14 of the first MOS transistor 101 and the drain 20 of the second MOS transistor 102 are formed in the process of N+ ion implantation. As described above, the source 18 of the second MOS transistor 102 and the source 14 of the first MOS transistor 101 can have the same type, it depends on the actual operating voltage applied to the second MOS transistor 102. If the source of the second MOS transistor and the drain and the source of the first transistor have the same type, the source of the second MOS transistor and the drain and source of the first MOS transistor are manufactured simultaneously.

Step 3 of the method of manufacturing the read-only includes following steps:

Step 31, a photoresist is coated on a surface of the silicon substrate with the control gate.

Step 32, a photoresist on a region of the drain and source of the first MOS transistor to be formed is removed, photoresists on a region of the drain or the source of the second MOS transistor to be formed which have the same-type with the source of the first MOS transistor and on a region of the drain and the source of the peripheral devices are removed simultaneously.

Step 33, an ion implantation process is performed to the region which has been removed from the photoresist to form a source and a drain.

Step 34, the photoresist remained on the surface of the silicon substrate after the ion implantation is removed.

Step 32 includes following steps:

A region of the drain and source of the first MOS transistor and a region of the drain or the source of the second MOS transistor which has a same-type with the source of the first MOS transistor and a region of the source and drain of the peripheral devices are defined on a first drain and source mask plate.

A photoresist located on the surface of the silicon substrate with the control gate is exposed by using the first drain and source mask plate. The photoresist formed on the drain region and the source region defined by the first drain and source mask plate on the surface of the silicon substrate is developed and removed.

Step 4, referring to FIG. 1 and FIG. 2, the source 18 or the drain 20 of the second MOS transistor 102 which has an inverse type with the source 14 of the first MOS transistor 101 and a source and a drain of the peripheral device which have inverse type with the source 14 of the first MOS transistor 101 are formed on the active region 10 on two sides of the control gate 11. For example, the storage unit is P-type of storage unit, the drain 16 and the source 14 of the first MOS transistor 101 are both P-type. The source 18 of the second MOS transistor 102 which has an inverse type with the source 14 of the first MOS transistor 101 is N-type. The source 18 of the second MOS transistor 102 and the drain and the source of an NMOS transistor of the peripheral device are formed in one N+ ion implantation process. If the storage units are N-type of storage units, the drain 16 and the source 14 of the first MOS transistor are N-type, the source 18 of the second MOS transistor 102 is P-type. The source 18 of the second MOS transistor 102 and the drain and the source of the PMOS transistor of the peripheral device are formed in one P+ ion implantation process. For the same reason as step 3, in other embodiments, the source of the first MOS transistor 101 and the drain of the second MOS transistor have inverse type. The reason for this will not be stated again.

Step 4 includes following steps:

Step 41, a photoresist is coated on the surface of the silicon substrate with control gate.

Step 42, photoresists on a region of the source and drain of the second MOS transistor which has inverse type with the source of the first MOS transistor and on a region of the source and drain of the peripheral device are removed simultaneously.

Step 43, an ion implantation process which has inverse type with the source of the first MOS transistor is performed to the region which has been removed from the photoresist to form a source and a drain.

Step 44, the photoresist remained on the surface of the silicon substrate after ion implantation is removed.

Step 42 includes following steps:

a second drain and source mask plate is provides, a source or a drain region of the second MOS transistor which has inverse-type with the source of the first MOS transistor and a source region and a drain region of the peripheral device are defined on the second drain and source mask plate.

A photoresist located on the surface of the silicon substrate with the control gate is exposed by using the second drain and source mask plate. A photoresist formed on a drain region and a source region defined by the second drain and source mask plate on the surface of the silicon substrate is developed and removed.

A sequence of step 3 and step 4 can be changed in the manufacturing process. The drain 20 and the source 18 of the second MOS transistor 102 are manufactured in two processes: the N+ ion implantation process and the P+ ion implantation process, the two processes are performed by using the first drain and source mask and the second drain and source mask plate respectively. Referring to FIG. 3, it is a schematic partial layout of the storage unit of the read-only memory, it is a superposition of partial layout of a first drain and source mask plate and a second drain and source mask plate storage units. Take the P-type of storage unit as an example, the active region 10 shown in FIG. 3 corresponds to the active region shown in FIG. 1 and FIG. 2, the control gate 11 shown in FIG. 3 corresponds to the control gate 11 shown in FIG. 1 and FIG. 2. A P-type ion implantation process is performed in the P+ ion implantation region 21, the source 14 and the drain 16 of the first MOS transistor 101 of the P-type storage unit shown in FIG. 1, and the drain 20 of the second MOS transistor 102 shown in FIG. 2 are formed simultaneously. The source 18 of the second MOS transistor 102 is formed in the N+ ion implantation region 25.

The peripheral device of the read-only memory usually includes the NMOS type and PMOS type of MOS transistor. The source and drain of the second MOS transistor are manufactured according to the manufacturing of the source and drain of the above two kinds MOS transistor. The manufacturing of the read-only memory is compatible with the manufacturing process of the conventional read-only memory. Compared to the manufacturing of the conventional read-only memory, no extra mask plate and related process are needed in the present method. The manufacturing cycle of the read-only memory is shortened and the cost is reduced.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A mask read-only memory, comprising a plurality of storage units arranged in an array, wherein the mask read-only memory comprises two kinds of storage units with different structures, the two kinds of storage units with different structures are a first MOS transistor and a second MOS transistor, a source and a drain of the first MOS transistor have the same type, a source and a drain of the second MOS transistor have inverse types,
   wherein the first MOS transistor and the second transistor are both provided with control gates of their own each formed directly on a gate oxide dielectric, the first MOS transistor and the second MOS transistor are both provided with lightly doped drain regions located between the drain and its control gate and between the source and its control gate,
   wherein sidewalls of the control gate are formed on the respective lightly doped regions,
   outer edges of the sidewalls coincide with inners edge of the source and drain, respectively, of each of the first MOS transistor and the second MOS transistor, and
   the mask read-only memory is unrewritable and inerasable.

2. The read-only memory according to claim 1, wherein the two kinds of storage units with different structures are P-type storage units, the source and the drain of the first MOS transistor are P-type, the drain of the second MOS transistor is P-type, the source of the second MOS transistor is N-type.

3. The read-only memory according to claim 1, wherein the two kinds of storage units with different structures are N-type storage units, the source and the drain of the first MOS transistor are N-type, the drain of the second MOS transistor is N-type, the source is P-type.

4. A method of manufacturing the mask read-only memory according to claim 1, the mask read-only memory comprising storage units and peripheral devices surrounding the storage units, the method comprising:
   step 1, providing a silicon substrate, forming active regions of the storage units and the peripheral devices on the silicon substrate simultaneously;
   step 2, forming a gate oxide dielectric and a control gate of the storage units and the peripheral devices on surfaces of the active regions;
   step 2a, forming lightly doped drain regions on two sides of the control gate;
   step 2b, forming sidewalls on the lightly doped drain regions;
   step 3, forming a source and a drain of a first MOS transistor and a drain or a source of a second MOS transistor of the storage unit, and a source and a drain of the peripheral device on an active region simultaneously on the outside of the lightly doped drain regions and the sidewalls formed on the two sides of the control gate using a single first mask, such that outer edges of the sidewalls coincide with inners edge of the source and drain, respectively, of each of the first and second MOS transistors, the source of the first MOS transistor and the source or the drain of the second MOS transistor having the same type, the source of the first MOS transistor and the source and the drain of the peripheral device having the same type; and
   step 4, forming a source and a drain of the second MOS transistor and a source and a drain of the peripheral device on the active region simultaneously on the outside of the lightly doped drain regions and the sidewalls formed on the two sides of the control gate using a single first mask, the source of the first MOS transistor and the source or the drain of the second MOS transistor having inverse types, the source of the first MOS transistor and the source and the drain of the peripheral device having inverse types.

5. The read-only memory according to claim 1, wherein a distance between inner edges of the lightly doped drain regions is substantially the same as a width of the control gate.

6. The read-only memory according to claim 1, wherein the source and drain of the first MOS transistor and the second MOS transistor are formed separately from the lightly doped drain regions.

* * * * *